United States Patent
Daimon et al.

(10) Patent No.: US 9,540,563 B2
(45) Date of Patent: Jan. 10, 2017

(54) COATED PHOSPHOR AND METHOD FOR PRODUCING COATED PHOSPHOR

(71) Applicant: Dexerials Corporation, Tokyo (JP)

(72) Inventors: Masahide Daimon, Tochigi (JP); Takehiro Yamasuge, Tochigi (JP); Tsuneo Kusunoki, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 14/363,577

(22) PCT Filed: Dec. 5, 2012

(86) PCT No.: PCT/JP2012/081477
§ 371 (c)(1),
(2) Date: Jun. 6, 2014

(87) PCT Pub. No.: WO2013/084921
PCT Pub. Date: Jun. 13, 2013

(65) Prior Publication Data
US 2014/0293609 A1    Oct. 2, 2014

(30) Foreign Application Priority Data
Dec. 7, 2011  (JP) .................................. 2011-267680

(51) Int. Cl.
| | | |
|---|---|---|
| C09K 11/02 | (2006.01) | |
| C09K 11/77 | (2006.01) | |
| H01L 33/50 | (2010.01) | |
| F21K 2/00 | (2006.01) | |
| G02F 1/1335 | (2006.01) | |

(52) U.S. Cl.
CPC .......... *C09K 11/025* (2013.01); *C09K 11/7731* (2013.01); *F21K 2/00* (2013.01); *H01L 33/504* (2013.01); *G02F 1/133603* (2013.01); *G02F 2001/133614* (2013.01); *H01L 2224/48091* (2013.01); *H01L 2224/73265* (2013.01)

(58) Field of Classification Search
CPC .......................... C09K 11/0805; C09K 11/025
USPC ......................................................... 428/690
See application file for complete search history.

(56) References Cited

U.S. PATENT DOCUMENTS

2008/0241590 A1* 10/2008 Kim et al. .................... 428/690

FOREIGN PATENT DOCUMENTS

| JP | H01-284583 A | 11/1989 |
|---|---|---|
| JP | 6-65570 A | 3/1994 |
| JP | 7-188650 A | 7/1995 |
| JP | 9-272866 A | 10/1997 |
| JP | 2003-213257 A | 7/2003 |

(Continued)

OTHER PUBLICATIONS

Extended European Search Report issued in corresponding European Application No. 12856565.2 dated Sep. 9, 2015 (6 pages).

(Continued)

*Primary Examiner* — Nimeshkumar Patel
*Assistant Examiner* — Christopher Raabe
(74) *Attorney, Agent, or Firm* — Osha Liang LLP (57) ABSTRACT

A coated phosphor includes a sulfide phosphor coated with silicon dioxide film. The silicon dioxide film includes a metal oxide powder. The metal oxide powder includes a zinc oxide powder such that less than 20 parts by mass of the zinc oxide powder relative to 100 parts by mass of the sulfide phosphor is blended therein.

11 Claims, 8 Drawing Sheets

(56) References Cited

FOREIGN PATENT DOCUMENTS

| | | |
|---|---|---|
| JP | 2006-188700 A | 7/2006 |
| JP | 2007-023221 A | 2/2007 |
| JP | 2007-091874 A | 4/2007 |
| JP | 2008-115223 A | 5/2008 |
| JP | 2008-205437 A | 9/2008 |
| JP | 2008-308510 A | 12/2008 |
| JP | 2010-209194 A | 9/2010 |
| WO | 2012/077656 A1 | 6/2012 |
| WO | 2012/137552 A1 | 10/2012 |
| WO | 2013/021990 A1 | 2/2013 |

OTHER PUBLICATIONS

International Search Report issued in PCT/JP2012/081477 mailed on Mar. 12, 2013 (4 pages).

\* cited by examiner

COATED PHOSPHOR AND METHOD FOR PRODUCING COATED PHOSPHOR

CROSS-REFERENCE TO RELATED APPLICATIONS

This application is a National Stage application of International Patent Application No. PCT/JP2012/081477, filed on Dec. 5, 2012, and claims priority pursuant to 35 U.S.C. §119(a) to Japanese Patent Application No. P2011-267680, filed on Dec. 7, 2011. The international application and priority application are hereby incorporated by reference in their entirety.

BACKGROUND OF INVENTION

Field of the Invention

One or more embodiments of the present invention relate to a coated phosphor in which a phosphor is coated with a coating material and a method for producing the coated phosphor.

Background Art

Conventionally, it has been known that a sulfide phosphor is subjected to a hydrolysis reaction by water or the like to be changed to an oxide or a hydroxide, with the result that its characteristics, such as a light emitting intensity, a luminance or the like, are seriously lowered.

Patent Document 1 and Patent Document 2 have described methods in which by coating the surface of a phosphor with silicon dioxide by using a metal alkoxide through a sol-gel method, the phosphor is prevented from being made in contact with water so that the degradation of a phosphor due to hydrolysis is prevented and the characteristics of the phosphor (such as light-emitting intensity, luminance or the like) can be properly maintained.

However, even in the case when, by using methods described in Patent Document 1 and Patent Document 2, a moisture preventive property is achieved, the moisture preventive property is insufficient, and under a high-temperature, high-humidity condition, a sulfide phosphor may react with water to release a sulfur-based gas such as hydrogen sulfide or the like from the sulfide phosphor. When the sulfur-based gas is discharged, electrodes or the like are corroded in an electronic material system to cause degradation or the like of the conductivity.

RELATED ART

Patent Document

PTL 1: Japanese Patent Application Laid-Open (Tokkai-Hei) No. 01-284583
PTL 2: Japanese Patent Application Laid-Open No. 2007-23221

In view of these circumstances, one or more embodiments of the present invention provide a coated phosphor capable of preventing a release of sulfur-based gas even in high-temperature, high-humidity conditions, and a method for producing such a coated phosphor.

SUMMARY OF INVENTION

The coated phosphor one or more embodiments of the present invention is formed by coating a sulfide phosphor with a silicon dioxide film containing a metal oxide powder.

The method for producing the coated phosphor according to one or more embodiments of the present invention includes a mixing process in which a sulfide phosphor, an alkoxysilane, a metal oxide powder and a catalyst are mixed in a solvent so that the sulfide phosphor is coated with a silicon dioxide film containing the metal oxide powder and formed with alkoxysilane.

A white color light source according to one or more embodiments of the present invention includes a blue light emitting element formed on an element substrate, and a kneaded matter that is placed on the blue light emitting element, and formed by kneading a red color phosphor and a green color phosphor or a yellow color phosphor in a transparent resin, with a sulfide phosphor being coated with the green color phosphor by using a silicon dioxide film containing the metal oxide powder.

An illumination device according to one or more embodiments of the present invention includes a light-emitting structure in which a blue light emitting element is contained with a transparent resin, a substrate on which the light-emitting structures are two-dimensionally disposed and a phosphor sheet that is disposed so as to be spaced apart from the substrate, and contains a powder-state phosphor for obtaining white-color light from blue-color light derived from the blue light emitting element, and as the phosphor, a sulfide phosphor is coated with a silicon dioxide film in which the metal oxide powder is contained.

In accordance with one or more embodiments of the present invention, because sulfur-based gases released from the sulfide phosphor by hydrolysis of the sulfide phosphor are adsorbed by the metal oxide powder, it may be possible to suppress the release of the sulfur-based gases even under high-temperature, high-humidity conditions.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. Referring to Figures, the following description will discuss one or more embodiments of the present invention in detail in the following order.

Figure 8:
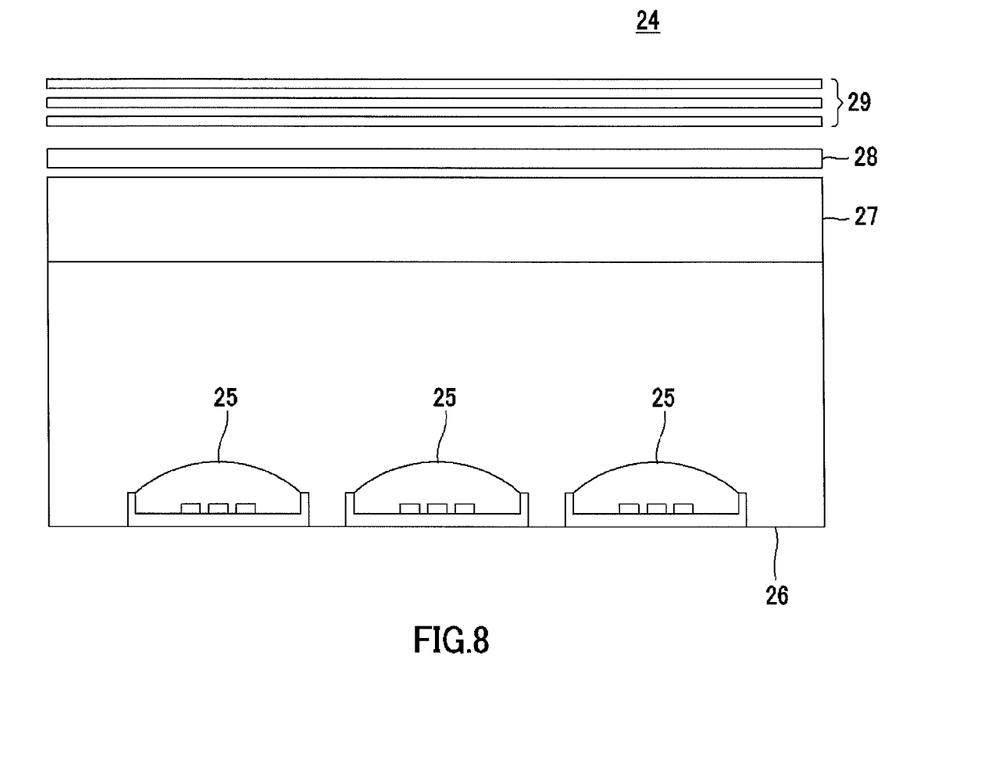
FIG. 8 is a cross-sectional view showing one example of an illumination device according to one or more embodiments of the present invention.
Figure 9:
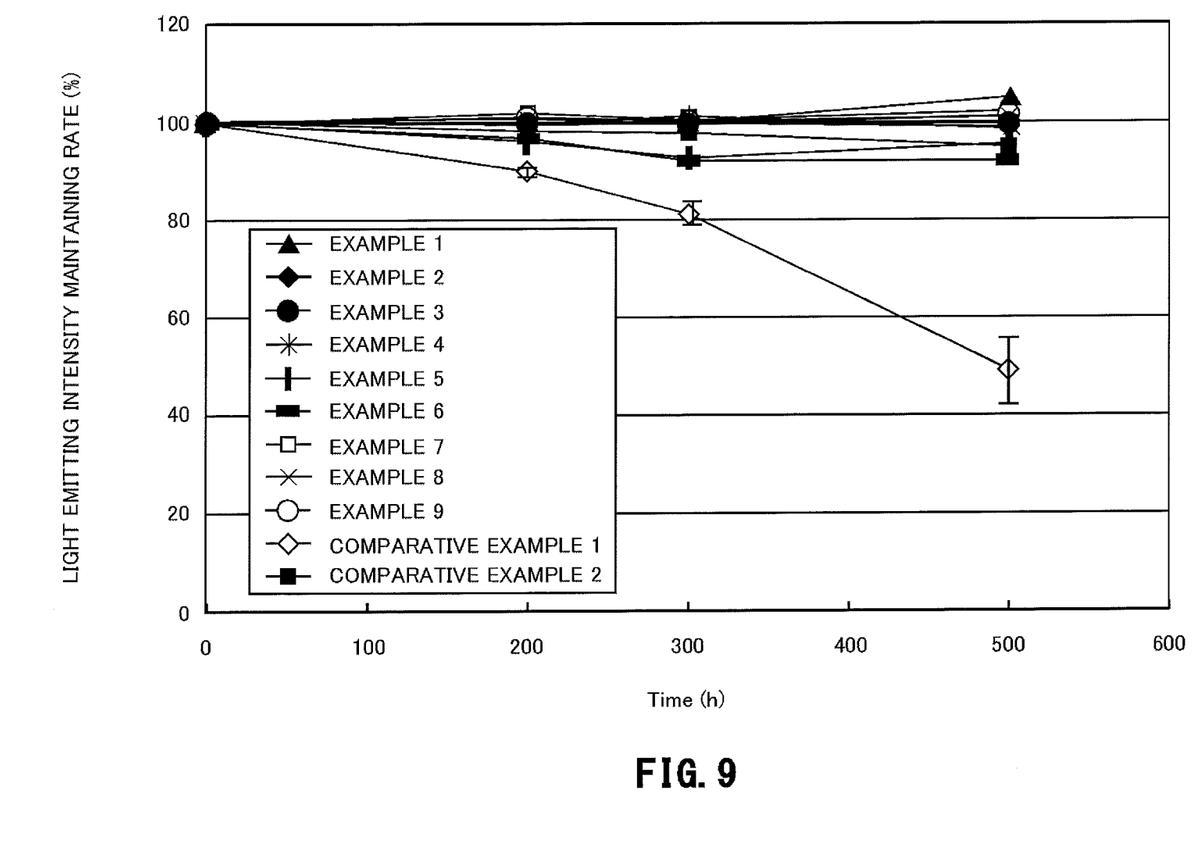
FIG. 9 is a graph showing the results of a high-temperature, high-humidity test according to one or more embodiments of the present invention.
Figure 10:
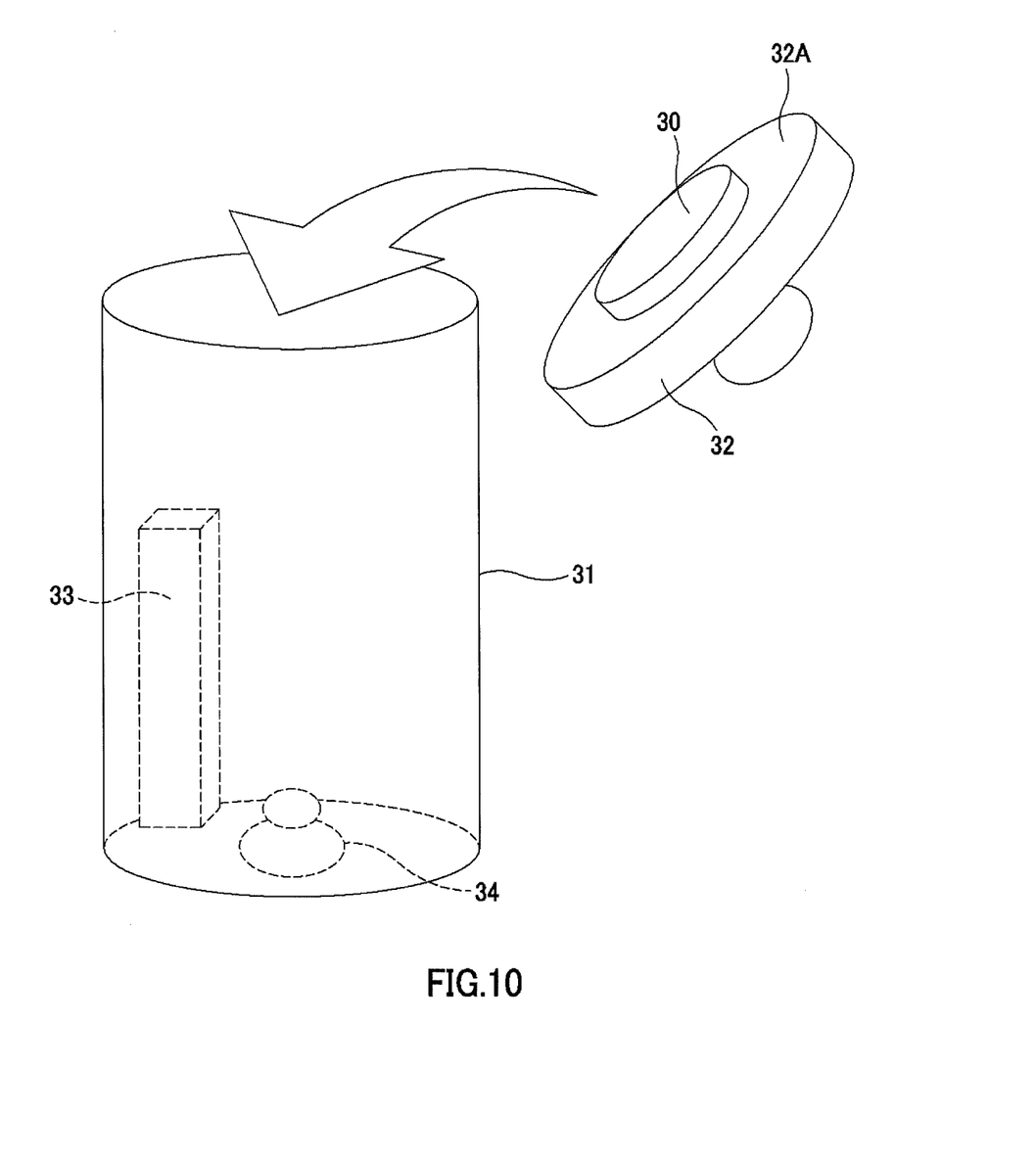
FIG. 10 is a drawing for explaining a method for a silver piece test according to one or more embodiments of the present invention.

1. Coated Phosphor (FIGS. 1 to 5)
2. Production Method for Coated Phosphor
3. Applied Examples of Coated Phosphor (FIGS. 6 to 8)
4. Examples (FIGS. 9 and 10)

Additionally, embodiments of the present invention are not intended to be limited by the following description, and various modifications may be made without departing from the spirit of the present invention.

<1. Coated Phosphor>

Figure 1:
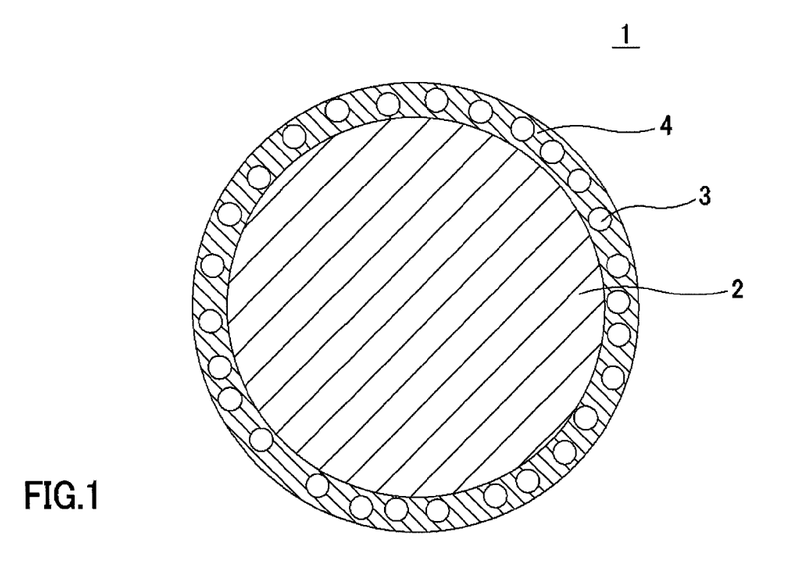
FIG. 1 is a cross-sectional view showing one example of a coated phosphor according to one or more embodiments of the present invention.
Figure 2:
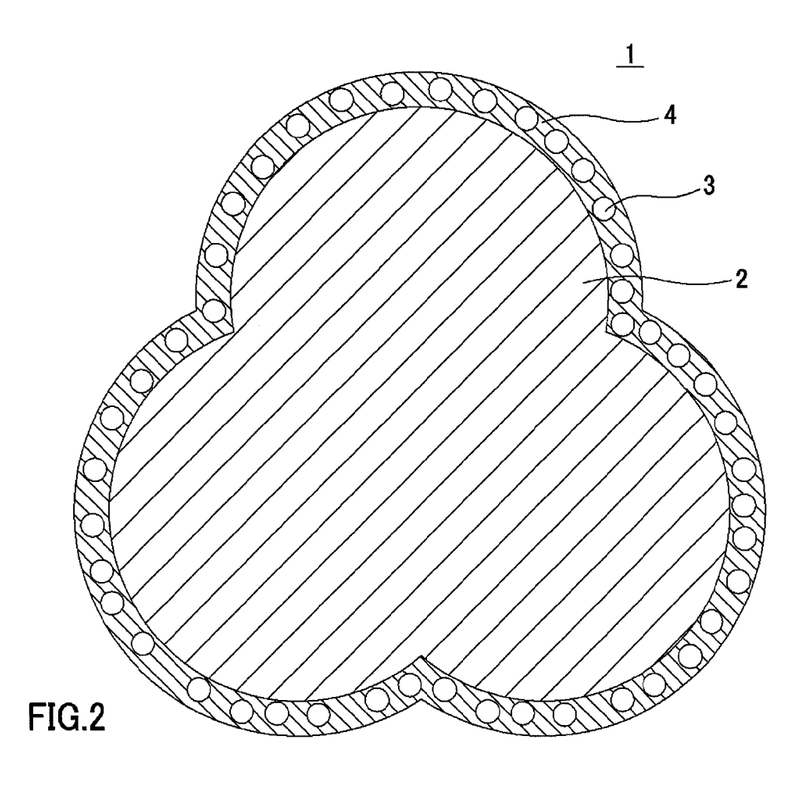
FIG. 2 is a cross-sectional view showing the example of the coated phosphor according to one or more embodiments of the present invention.

For example, as shown in FIG. 1, a coated phosphor 1 according to one or more embodiments of the present invention has a structure in which a sulfide phosphor 2 is coated with a silicon dioxide film 4 containing metal oxide powder 3. Because the sulfide phosphor 2 is coated with the silicon dioxide film 4 containing metal oxide powder 3, a sulfur-based gas released from the sulfide phosphor 2 due to hydrolysis of the sulfide phosphor 2 is adsorbed to the metal oxide powder 3. For this reason, for example, under a high-temperature, high-humidity condition, the release of the sulfur-based gas from the sulfide phosphor 2 can be suppressed. Therefore, for example, in an electronic material system, it may be possible to prevent corrosion of electrodes or the like, and subsequent degradation of conductivity or the like. Additionally, as shown in FIG. 1, supposing that a particle considered to be a unit particle is defined as a primary particle, a secondary particle in which, as shown in FIG. 2, two or more of the primary particles are coupled to each other may be used.

Although not particularly limited, as the sulfide phosphor 2, for example, $SrGa_2S_4$:Eu and CaS:Eu may be used. As the sulfide phosphor 2, those particles having, for example, a median diameter ($d_{50}$) of about 5 to 15 μm may be used.

As the metal oxide powder 3, those powders having a superior capability of adsorbing sulfur-based gases, such as, for example, hydrogen sulfide, and capable of exerting a suppression effect for sulfur-based gases may be used. Examples of such a metal oxide powder 3 include zinc oxide powder and aluminum oxide ($Al_2O_3$) powder, and in particular, from the viewpoint of effectively exerting the suppressing effect for sulfur-based gases, zinc oxide powder may be used. Moreover, as the metal oxide powder 3, those subjected to a surface treatment may be used.

The metal oxide powder 3 may have a particle diameter of 0.2 μm or less. By setting the particle diameter of the metal oxide powder 3 to 0.2 μm or less, the capability of the metal oxide powder 3 for adsorbing the sulfur-based gases released from the sulfide phosphor 2 due to hydrolysis of the sulfide phosphor 2 is prevented from being lowered. Thus, it may be possible to effectively suppress the release of the sulfur-based gases from the sulfide phosphor 2.

The amount of the metal oxide powder 3 may be set to 1 part by mass or more to less than 20 parts by mass relative to 100 parts by mass of the sulfide phosphor 2, and may be 5 parts by mass or more to 10 parts by mass or less. By setting the amount of the metal oxide powder 3 to 1 part by mass or more relative to the 100 parts by mass of the sulfide phosphor 2, the effective adsorbing function of the metal oxide powder 3 can be obtained, that is, it may be possible to prevent the capability of the metal oxide powder 3 for adsorbing the sulfur-based gases from being lowered. Moreover, by setting the amount of the metal oxide powder 3 to less than 20 parts by mass relative to the 100 parts by mass of the sulfide phosphor 2, it may be possible to prevent the characteristics of the sulfide phosphor 2, such as, for example, the peak intensity and luminance, from being lowered.

The silicon dioxide film 4 is formed on the surface of the sulfide phosphor 2 so as to coat the surface of the sulfide phosphor 2. By coating the sulfide phosphor 2 with the silicon dioxide film 4, the sulfide phosphor 2 is prevented from being in contact with water so that the sulfide phosphor 2 is prevented from deteriorating by hydrolysis. Thus, it may be possible to prevent the characteristics of the sulfide phosphor 2, such as, for example, the light-emitting intensity and luminance, from being lowered, and consequently to maintain the characteristics of the sulfide phosphor 2. The silicon dioxide film 4 is formed by, for example, hydrolysis (sol-gel method) of alkoxysilane.

The thickness of the silicon dioxide film 4 may be set to such an extent as to coat the metal oxide powder 3 with the silicon dioxide film 4. For example, in the case when the metal oxide powder 3 having a particle diameter of 0.2 μm or less is used, the thickness of the silicon dioxide film 4 may be set to 50 to 150 nm. By setting the thickness of the silicon dioxide film 4 to 50 nm or more, it is possible to more effectively prevent the sulfide phosphor 2 from deteriorating due to hydrolysis. Moreover, by setting the thickness of the silicon dioxide film 4 to 150 nm or less, it may be possible to prevent the characteristics of the sulfide phosphor 2, such as, for example, the peak intensity and luminance, from being lowered.

As described above, because the coated phosphor 1 has a structure in which the sulfide phosphor 2 is coated with the silicon dioxide film 4 containing the metal oxide powder 3, sulfur-based gases released from the sulfide phosphor 2 due to hydrolysis of the sulfide phosphor 2 are adsorbed onto the metal oxide powder 3. Therefore, it is possible to suppress the release of the sulfur-based gases from the sulfide phosphor 2, for example, under a high-temperature, high-humidity condition.

Moreover, because the coated phosphor 1 has the structure in which the sulfide phosphor 2 is coated with the silicon dioxide film 4 containing the metal oxide powder 3, the sulfide phosphor 2 is prevented from being in contact with water so that it is possible to prevent the sulfide phosphor 2 from deteriorating due to hydrolysis. Thus, it may be possible to prevent the characteristics of the sulfide phosphor 2 from being lowered.

Figure 3:
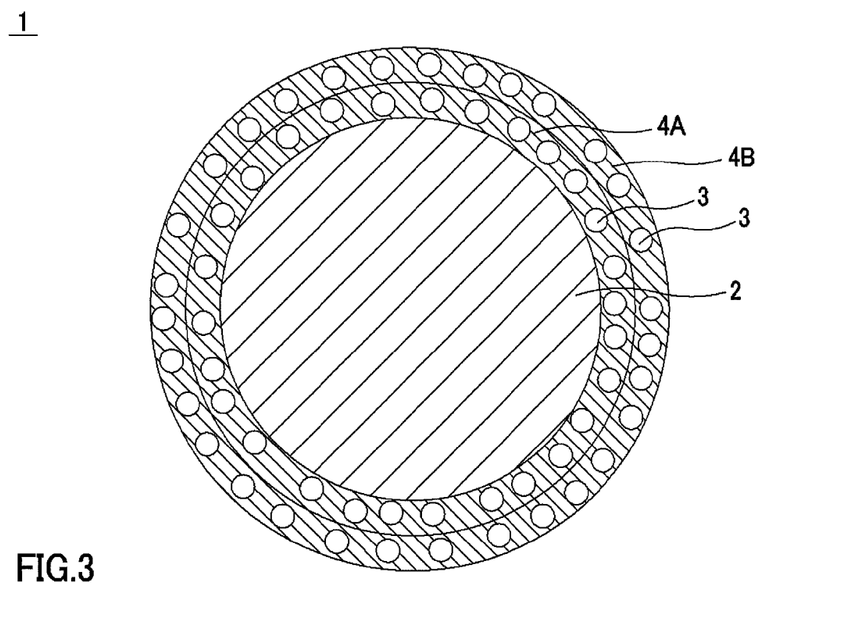
FIG. 3 is a cross-sectional view showing the example of the coated phosphor according to one or more embodiments of the present invention.
Figure 4:
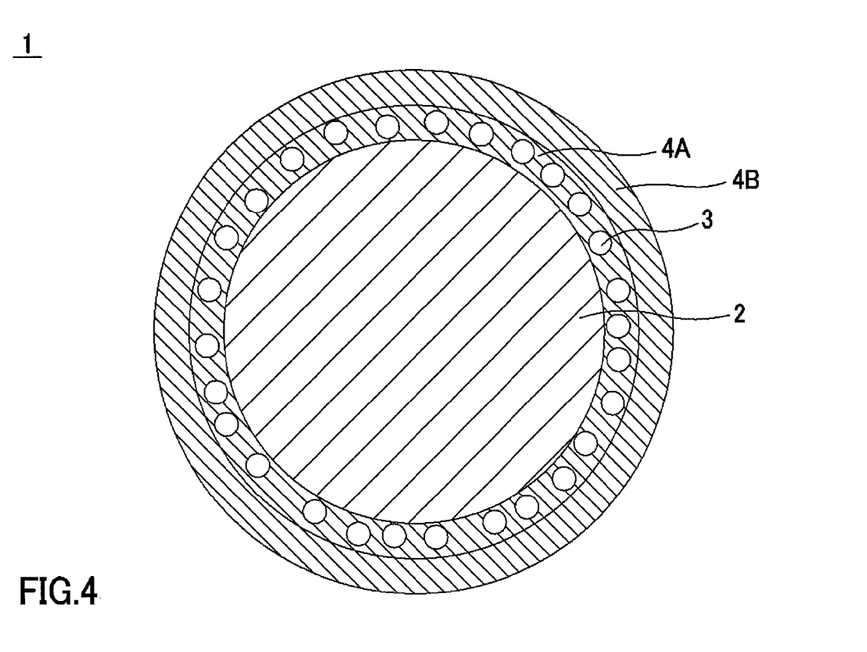
FIG. 4 is a cross-sectional view showing the example of the coated phosphor according to one or more embodiments of the present invention.
Figure 5:
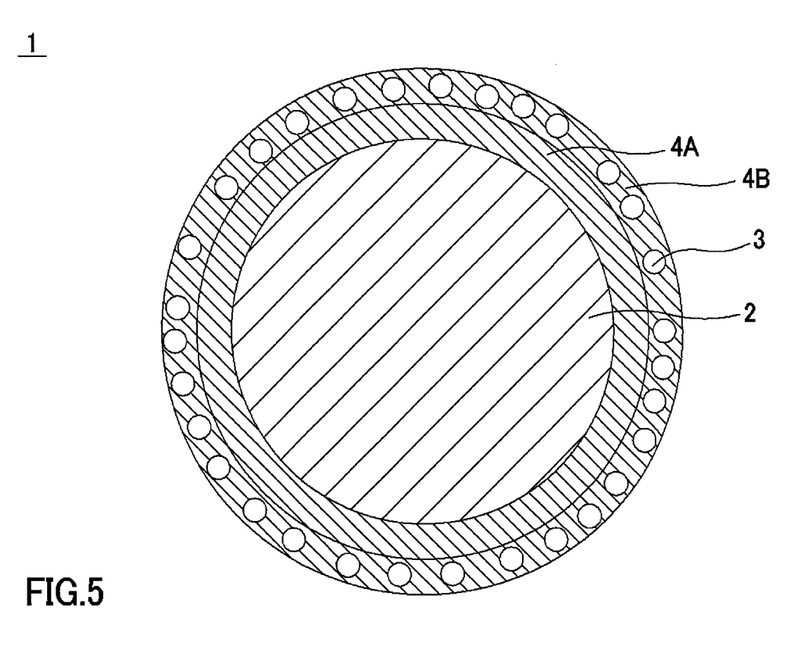
FIG. 5 is a cross-sectional view showing the example of the coated phosphor according to one or more embodiments of the present invention.

Additionally, as shown in FIGS. 3 to 5, the coated phosphor 1 may have a structure in which the sulfide phosphor 2 is coated with two or more layers of the silicon dioxide films 4, with the metal oxide powder 3 being contained in at least any one of the silicon dioxide films 4.

As shown in FIG. 3, the coated phosphor 1 may have a structure in which two layers of the silicon dioxide films 4, that is, a silicon dioxide film 4A containing the metal oxide powder 3 and a silicon dioxide film 4B containing the metal oxide powder 3, are coated on the sulfide phosphor 2 in this order. Moreover, as shown in FIG. 4, the coated phosphor 1 may have a structure in which a silicon dioxide film 4A containing the metal oxide powder 3 and a silica coated film, that is, a silicon dioxide film 4B containing no metal oxide powder 3, are coated on the sulfide phosphor 2 in this order. Furthermore, as shown in FIG. 5, the coated phosphor 1 may have a structure in which a silicon dioxide film 4A containing the metal oxide powder 3 and a silicon dioxide film 4B containing no metal oxide powder 3 are coated on the sulfide phosphor 2 in this order.

Among the coated phosphors 1 shown in FIGS. 3 to 5, from the viewpoint of effectively suppressing the release of sulfur-based gases from the sulfide phosphor 2, for example, under a high-temperature, high-humidity condition, those, shown in FIGS. 3 and 5, containing the metal oxide powder 3 at least in the silicon dioxide film 4B may be used. That is, the coated phosphor 1 in which the metal oxide powder 3 is contained in the silicon dioxide film 4B located on the uppermost surface side may be used.

<2. Method for Manufacturing Coated Phosphor>

A method for manufacturing the coated phosphor according to one or more embodiments of the present invention is provided with a mixing process in which the sulfide phosphor 2, the alkoxysilane, the metal oxide powder 3 and a catalyst are mixed in a solvent so that the sulfide phosphor 2 is coated with the silicon dioxide film 4 made of alkoxysilane containing the metal oxide powder 3. Next, the method for manufacturing the coated phosphor according to one or more embodiments of the present invention is further provided with a separation process for separating the mixed solution into a solid phase and a liquid phase.

(Mixing Process)

The alkoxysilane may be selected from ethoxide, methoxide, isopropoxide or the like, and examples thereof include tetraethoxy silane and tetramethoxy silane. Moreover, the alkoxysilane may be an alkoxysilane oligomer or a hydrolytic condensation product, such as polyethylsilicate or the like. Furthermore, as the alkoxysilane, a silane coupling agent having an alkyl group, an amino group, a mercapto group or the like, which does not devote to a sol-gel reaction, such as alkyl alkoxysilane or the like, may be used.

Not particularly limited, for example, water, an organic solvent or the like may be used as the solvent. Examples of the organic solvent include: alcohol, ether, ketone, polyhydric alcohols or the like may be used. Examples of ethanol, methanol, propanol, pentanol or the like may be used as the alcohol. Examples of ethylene glycol, propylene glycol, diethylene glycol or the like may be used as the polyhydric alcohols. Moreover, as the solvent, those formed by combining two kinds or more solvents may be used.

The catalyst is used for initiating a hydrolytic or polycondensation reaction of alkoxysilane, and for example, an acidic catalyst or a basic catalyst may be used. Examples of the acidic catalyst include hydrochloric acid, sulfuric acid, boric acid, nitric acid, perchloric acid, tetrafluoroboric acid, hexafluoroarsenic acid, hydrobromic acid, acetic acid, oxalic acid, methane-sulfonic acid or the like. Examples of the basic catalyst include hydroxides of alkali metal, such as sodium hydroxide, ammonia or the like. Among these catalysts, from the viewpoint of effectively preventing degradation of the sulfide phosphor 2, basic catalysts may be used.

Additionally, as the catalyst, two or more kinds of these acidic catalysts and basic catalysts may be used in combination.

With respect to the compounding amounts of the sulfide phosphor 2 and the metal oxide powder 3, 1 part by mass or more to less than 20 parts by mass of the metal oxide powder 3 may be blended in 100 parts by mass of the sulfide phosphor 2. As described earlier, by blending 1 part by mass or more of the metal oxide powder 3 to 100 parts by mass of the sulfide phosphor 2, an effective adsorbing function of the metal oxide powder 3 can be obtained. Moreover, by blending less than 20 parts by mass of the metal oxide powder 3 to 100 parts by mass of the sulfide phosphor 2, it may be possible to prevent the characteristics of the sulfide phosphor 2, such as, for example, the peak intensity and luminance, from being lowered.

(Separation Process)

In a separation process, by separating the mixed solution formed by mixing the sulfide phosphor 2 and the alkoxysilane in a solvent in the above-mentioned mixing process into a solid phase and a liquid phase, the coated phosphor serving as the solid phase can be obtained from the mixed solution.

For example, in the separation process, the mixed solution is separated into a solid phase and a liquid phase by using a suction filter, and the solid phase thus separated is dried and a sample obtained after the drying process is pulverized and subjected to a firing process. Thus, the coated phosphor 1 in which the sulfide phosphor 2 is coated with the silicon dioxide film 4 containing the metal oxide powder 3 can be obtained.

The temperature for drying the separated solid phase may be set in a range from 80 to 110° C., which may be changed depending on the solvent to be used. Moreover, the period of time for drying the solid phase thus separated may be set to 2 hours or more.

The temperature at which the sample is fired may be set in a range from 150 to 250° C. Moreover, the period of time for firing the pulverized sample may be set to 8 hours or more.

Additionally, the above description has been given by exemplifying a method in which, upon manufacturing the coated phosphor 1, the coating process of the silicon dioxide film 4 onto the sulfide phosphor 2 is carried out only once, that is, a method in which the sulfide phosphor 2 is coated with only one layer of the silicon dioxide film 4; however, one or more embodiments of the present invention is not limited by this example. For example, by carrying out the coating processes of the silicon dioxide film 4 repeatedly, two or more layers of the silicon dioxide films 4 may be coated on the sulfide phosphor 2. In the method for manufacturing the coated phosphor according to one or more embodiments of the present invention, because the peak intensity of the sulfide phosphor 2 is lowered in the case when multiple silicon dioxide films 4 are formed on the sulfide phosphor 2, the number of the coating processes may be set to 2 to 3 times.

<3. Applied Examples of Coated Phosphor>

The coated phosphor 1 obtained by the above-mentioned method for manufacturing the coated phosphor can be applied to, for example, a white light source and an illumination device.

<3-1. White Light Source>

Figure 6:
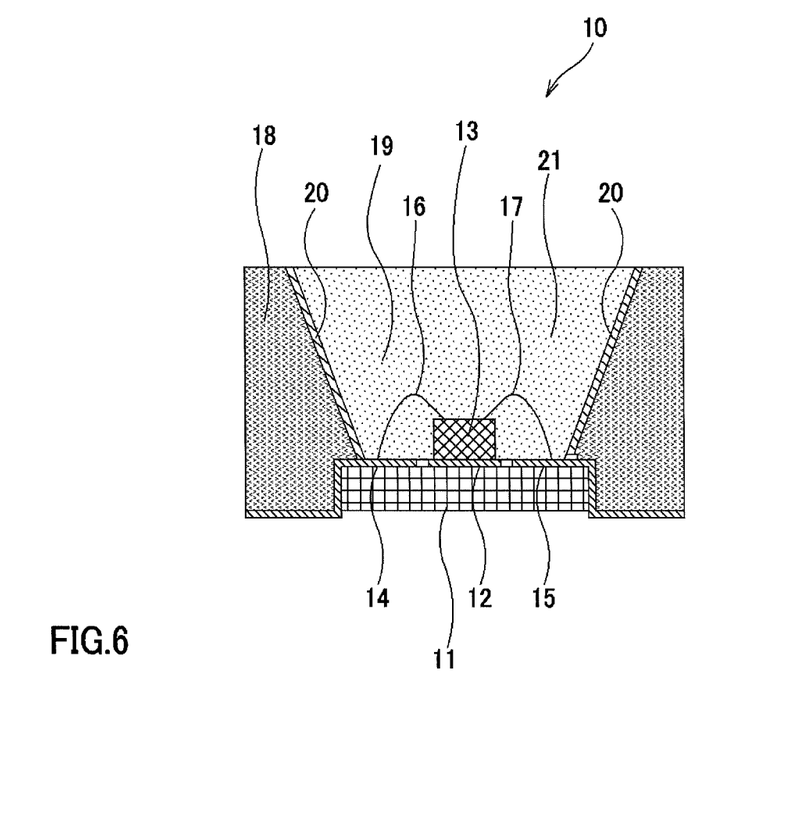
FIG. 6 is a cross-sectional view showing one example of a white light source according to one or more embodiments of the present invention.

First, referring to a cross-sectional view shown in FIG. 6, explanations will be given to a white light source according to one or more embodiments of the present invention. As shown in FIG. 6, a white light source 10 is provided with a blue light emitting element 13 on a pad unit 12 formed on an element substrate 11. On the element substrate 11, electrodes 14 and 15 for supplying power to drive the blue light emitting element 13 are formed in a manner so as to maintain insulation from each other, and the respective electrodes 14 and 15 are connected to the blue light emitting element 13, for example, by lead wires 16 and 17.

Moreover, on the periphery of the blue light emitting element 13, for example, a resin layer 18 is formed, and an opening portion 19 that forms an opening through the blue light emitting element 13 is formed on the resin layer 18. This opening portion 19 is formed so as to have a slanted surface with its opening area being expanded in a light-emitting direction of the blue light emitting element 13, and a reflection film 20 is formed on the slanted surface. That is, in the resin layer 18 having the opening portion 19 with a funnel-shape, the opening portion 19 is coated with a reflection film 20, with the blue light-emitting element 13 being disposed on the bottom surface of the opening portion 19. Moreover, inside the opening portion 19, a kneaded matter 21, which is formed by kneading a red phosphor, a green phosphor and a transparent resin in a mixed manner, is embedded so as to coat the blue light emitting element 13 so that the white light source 10 is configured.

As the green phosphor, the above-mentioned coated phosphor 1 is used. The green phosphor provides a peak light emitting wavelength in a green wavelength band, with a strong light emitting intensity and a high luminance. For this reason, a bright white light having wide color ranges derived from three primary colors of light composed of a blue light from the blue light emitting element, a red light from the red phosphor and a green light from the green phosphor can be obtained.

<3-2. Illumination Device>

Figure 7A:
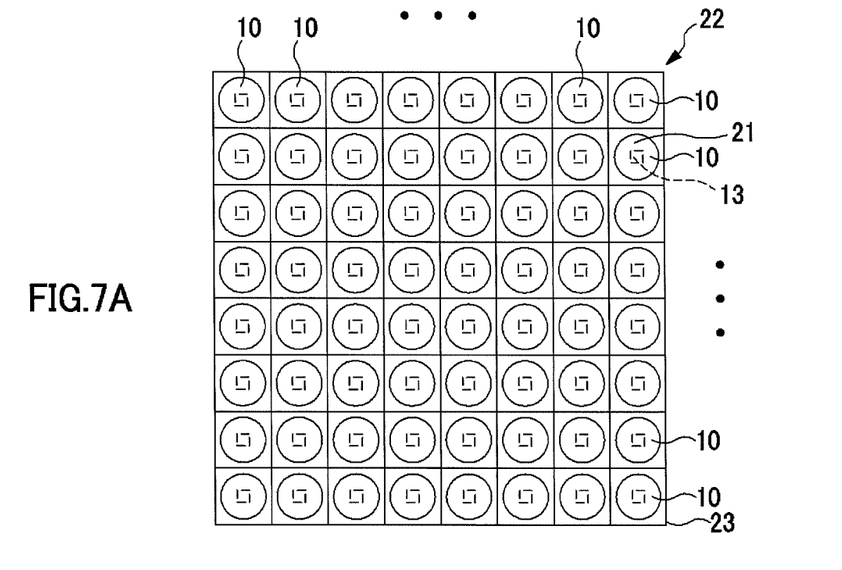
FIG. 7A is a plan view showing one example of an illumination device in which white light sources are arranged in a square lattice pattern according to one or more embodiments of the present invention.
Figure 7B:
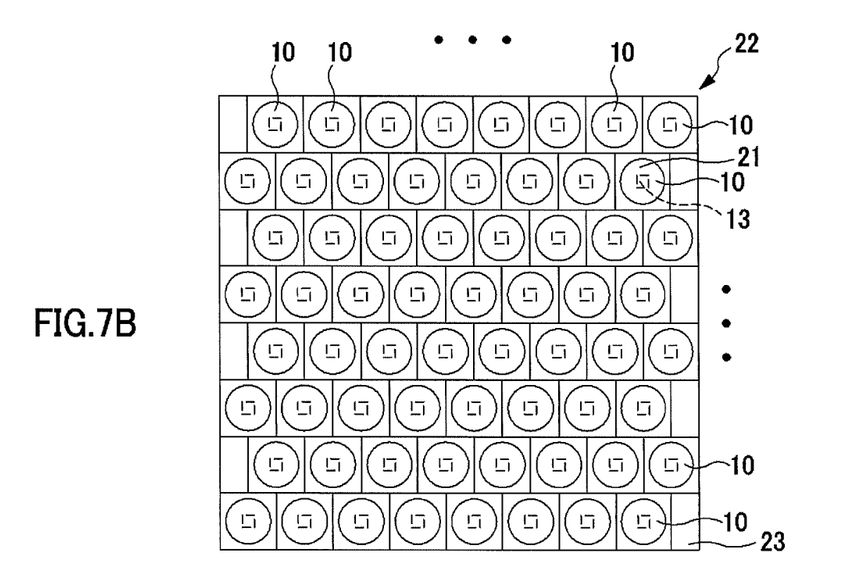
FIG. 7B is a plan view showing one example of the illumination device in which the white light sources are arranged with a deviation of a ½ pitch for every other row according to one or more embodiments of the present invention.

Next, referring to FIG. 7, the following description will discuss an illumination device according to one or more embodiments of the present invention. As shown in FIG. 7, an illumination device 22 has a plurality of the white light sources 10 explained by reference to FIG. 6, which are formed on an illumination substrate 23. Its arrangement example may be a square lattice arrangement, as shown in FIG. 7(A), or may be an arrangement with, for example, a deviation of a ½ pitch for every other row as shown in FIG. 7(B). Moreover, not limited to ½, the deviated pitch may be a ⅓ pitch or a ¼ pitch. Furthermore, the deviation may be given for every other row, or every other plural rows (for example, 2 rows).

Although not shown in Figures, an arrangement with, for example, a deviation of a ½ pitch for every other column may be used. Moreover, not limited to ½, the deviated pitch may be a ⅓ pitch or a ¼ pitch. Furthermore, the deviation may be given for every other row, or every other plural rows (for example, 2 rows). That is, the way how to deviate the white light source 10 is not particularly limited.

The white light source 10 has the same configuration as that explained by reference to FIG. 6. That is, the white light source 10 has a configuration in which a kneaded matter 21 formed by kneading a red color phosphor and a green color phosphor in a transparent resin is placed on a blue light emitting element 13. As the green color phosphor, the aforementioned green color phosphor may be used.

Moreover, because the illumination device 22 has a configuration in which the plural white light sources 10, each serving virtually the same as a point light emission, are arranged on the illumination substrate 23 laterally as well as longitudinally, light emission virtually the same as surface light emission can be obtained so that this can be used, for example, as a backlight of a liquid crystal display apparatus. Furthermore, the illumination device 22 may be used for illumination devices of various applications, such as normal illumination devices, image-shooting illumination devices, illumination devices for construction sites or the like.

Because the illumination device 22 uses the white light sources 10, it is possible to obtain white light that is bright and has a wide color range. For example, when this is used as the backlight of a liquid crystal display apparatus, a pure white color with high luminance is obtained on the display screen so that it may be possible to improve the quality of the display screen.

Moreover, the coated phosphor 1 according to one or more embodiments of the present invention may be applied to a phosphor sheet for an illumination device. For example, as shown in FIG. 8, an illumination device 24 is provided with light emission structures 25 in which blue light emitting elements are contained in a transparent resin having a convex surface shape, a substrate 26 on which the light emission structures 25 are two-dimensionally disposed, a diffusion plate 27 for diffusing blue light from the blue light emitting elements, a phosphor sheet 28 that is disposed so as to be spaced apart from the substrate 26 and contains powder-state phosphor for obtaining white light from the blue light of the blue light emitting elements, and an optical film 29.

The substrate 26 and the phosphor sheet 28 are disposed so as to be spaced apart from each other with a gap of about 10 to 50 mm, and the illumination device 24 constitutes a so-called remote phosphor structure. The gap between the substrate 26 and the phosphor sheet 28 is maintained by a plurality of support pillars and reflection plates, and the space formed by the substrate 26 and the phosphor sheet 28 is maintained in a manner so as to be surrounded by the support pillars and reflection plates from four sides.

The light emission structures 25 form a so-called LED package having, for example, InGaN-based blue LED (Light Emitting Diode) chips as the blue light emitting elements.

The substrate 26 is composed of a glass cloth substrate utilizing resins, such as phenol, epoxy, polyimide, polyester, bismaleimide-triazine, and allylated polyphenylene oxide resins or the like. On the substrate 26, the light emission structures 25 are two-dimensionally disposed with equal intervals with a predetermined pitch in a manner corresponding to the entire surface of the phosphor sheet 28. Moreover, if necessary, the mounting surface of the light emission structures 25 on the substrate 26 may be subjected to a reflection treatment.

The diffusion plate 27 is designed to diffuse the radiated light from the light emission structures 25 with a wide range in such a degree as to make the light sources invisible. As the diffusion plate 27, those plates having a total light-ray reflectance from 20% or more to 80% or less may be used.

The phosphor sheet 28 contains a powder-state phosphor for obtaining white light from blue light derived from the blue light emitting elements. As the powder of the phosphor, those having an average particle size of several $\mu$m to several tens of $\mu$m are used. Thus, it may be possible to improve the light scattering effect of the phosphor sheet 28.

The optical film 29 is composed of, for example, a reflection-type polarizing film, a lens film, a diffusion film or the like for improving the visibility of a liquid crystal display apparatus. In this case, the lens film is an optical film on one surface of which fine lens are arranged and formed, and used for improving the directivity of diffused light in a front direction so as to increase luminance.

As described above, by applying the coated phosphor 1 to the white light source 10, the illumination device 22 and the illumination device 24, it may be possible to suppress the release of the sulfur-based gases from the sulfide phosphor 2, for example, under high-temperature, high-humidity conditions. Thus, it is possible to prevent corrosion of electrodes or the like and subsequent degradation of conductivity or the like in the white light source 10, the illumination device 22 and the illumination device 24.

EXAMPLES

The following description will discuss examples of one or more embodiments of the present invention. In the examples, with respect to uncoated phosphors or coated phosphors obtained in example 1 to example 9, comparative example 1 and comparative example 2, light emitting characteristics evaluations, high-temperature, high-humidity environmental tests and silver piece corrosion tests were carried out. Additionally, one or more embodiments of the present invention may not limited by these examples.

Example 1

To a resin container (PE) were loaded a first compound (sulfide phosphor ($SrGa_2S_4$:Eu) (10 g), ethanol (80 g), pure water (5 g) and 28% aqueous ammonia (6 g)) and powder of zinc oxide having a particle diameter of 0.1 to 0.2 μm (K-FRESH MZO, made by TAYCA CORPORATION)(0.1 g)(one part by mass relative to 100 parts by mass of the sulfide phosphor), and a magnetic stirrer was put therein, and after having been stirred for 10 minutes in a thermostat bath of 40° C., to this was further added a second compound (tetraethoxysilane (5 g) and ethanol (35 g)). By setting the point of time when the addition of the second compound was completed to 0 minute, a stirring process was carried out for 3 hours. After the completion of the stirring process, a suction filtering process was carried out thereon by using a vacuum pump, thus a recovered sample was transferred to a beaker, and after having been washed with water and ethanol, the resulting sample was again filtered so that a sample was recovered. The recovered sample was dried at 85° C. for two hours, and then fired at 200° C. for 8 hours so that a coated phosphor was obtained.

Example 2

In example 2, the same processes as those of example 1 were carried out except that 0.5 g of powder of zinc oxide (K-FRESH MZO, made by TAYCA CORPORATION) having a particle diameter of 0.1 to 0.2 μm (5 parts by mass relative to 100 parts by mass of the sulfide phosphor) was used so that a coated phosphor was obtained.

Example 3

In example 3, the same processes as those of example 1 were carried out except that 1.0 g of powder of zinc oxide (K-FRESH MZO, made by TAYCA CORPORATION) having a particle diameter of 0.1 to 0.2 μm (10 parts by mass relative to 100 parts by mass of the sulfide phosphor) was used so that a coated phosphor was obtained.

Example 4

In example 4, the same processes as those of example 1 were carried out except that 2.0 g of powder of zinc oxide (K-FRESH MZO, made by TAYCA CORPORATION) having a particle diameter of 0.1 to 0.2 μm (20 parts by mass relative to 100 parts by mass of the sulfide phosphor) was used so that a coated phosphor was obtained.

Example 5

In example 5, the same processes as those of example 1 were carried out except that 5.0 g of powder of zinc oxide (K-FRESH MZO, made by TAYCA CORPORATION) having a particle diameter of 0.1 to 0.2 μm (50 parts by mass relative to 100 parts by mass of the sulfide phosphor) was used so that a coated phosphor was obtained.

Example 6

In example 6, the same processes as those of example 1 were carried out except that 10.0 g of powder of zinc oxide (K-FRESH MZO, made by TAYCA CORPORATION) having a particle diameter of 0.1 to 0.2 μm (100 parts by mass relative to 100 parts by mass of the sulfide phosphor) was used so that a coated phosphor was obtained.

Example 7

In example 7, the same processes as those of example 1 were carried out except that 0.5 g of powder of zinc oxide (made by Sakai Chemical Industry Co., Ltd.) having a particle diameter of 0.6 to 0.8 μm (5 parts by mass relative to 100 parts by mass of the sulfide phosphor) was used so that a coated phosphor was obtained.

Example 8

In example 8, the same processes as those of example 1 were carried out except that 0.5 g of powder of zinc oxide (FINEX made by Sakai Chemical Industry Co., Ltd.) having a particle diameter of 0.02 to 0.03 μm (5 parts by mass relative to 100 parts by mass of the sulfide phosphor) was used so that a coated phosphor was obtained.

Example 9

In example 9, the same processes as those of example 1 were carried out except that a total of 1.0 g of powder of zinc oxide (K-FRESH MZO, made by TAYCA CORPORATION) having a particle diameter of 0.1 to 0.2 μm (10 parts by mass relative to 100 parts by mass of the sulfide phosphor) was used and that coating processes were carried out two times so that a coated phosphor was obtained. As shown in FIG. 3, the coated phosphor 1 obtained in example 9 has a structure in which two layers of silicon dioxide films, that is, a silicon dioxide film containing zinc oxide powder and a silicon dioxide film containing zinc oxide powder, are coated on the sulfide phosphor in this order.

Example 10

In example 10, the same processes as those of example 1 were carried out except that 0.5 g of powder of zinc oxide (K-FRESH MZO, made by TAYCA CORPORATION) having a particle diameter of 0.1 to 0.2 μm (5 parts by mass relative to 100 parts by mass of the sulfide phosphor) was used and that coating processes were carried out two times so that a coated phosphor was obtained. As shown in FIG. 4, the coated phosphor 1 obtained in example 10 has a structure in which two layers of silicon dioxide films, that is, a silicon dioxide film containing zinc oxide powder and a silicon dioxide film containing no zinc oxide powder, are coated on the sulfide phosphor in this order.

Example 11

In example 11, the same processes as those of example 1 were carried out except that 0.5 g of powder of zinc oxide (K-FRESH MZO, made by TAYCA CORPORATION) having a particle diameter of 0.1 to 0.2 μm (5 parts by mass relative to 100 parts by mass of the sulfide phosphor) was used and that coating processes of two times were carried out so that a coated phosphor was obtained. As shown in FIG. 5, the coated phosphor 1 obtained in example 11 has a structure in which two layers of silicon dioxide films, that is, a silicon dioxide film containing no zinc oxide powder and a silicon dioxide film containing zinc oxide powder, are coated on the sulfide phosphor in this order.

Comparative Example 1

In comparative example 1, a phosphor (uncoated phosphor) having no coating process (sulfide phosphor ($SrGa_2S_4$:Eu) (10 g)) was used as it was.

Comparative Example 2

In comparative example 2, the same processes as those of example 1 were carried out except that no zinc oxide powder was used so that a coated phosphor was obtained.

Table 1 shows the summarized results of examples 1 to 11 and comparative example 1 and comparative example 2. In Table 1, encircled FIGS. (1, 2) in the column of coating processes respectively indicate a coating process of the first time or a coating process of the second time. Moreover, in Table 1, "ZnO mixed" refers to a silicon dioxide film containing zinc oxide powder, while "Silica" refers to a silicon dioxide film containing no zinc oxide powder.

TABLE 1

| | Example 1 | Example 2 | Example 3 | Example 4 | Example 5 | Example 6 | Example 7 | Example 8 | Example 9 | Example 10 | Example 11 | Comparative Example 1 | Comparative Example 2 |
|---|---|---|---|---|---|---|---|---|---|---|---|---|---|
| Coating process | Zinc oxide mixed coating process | | | | | | | | Coating processes of two times | | | Uncoated | Only coated film |
| | | | | | | | | | ① ZnO mixed ② ZnO mixed | ① ZnO mixed ② Silica | ① Silica ② ZnO mixed | | |
| Zinc oxide Particle diameter (μm) | | | 0.1-0.2 | | | | 0.6-0.8 | 0.02-0.03 | 0.1-0.2 | 0.1-0.2 | 0.1-0.2 | — | — |
| Zinc oxide Compounding amount (parts by mass) | 1 | 5 | 10 | 20 | 50 | 100 | 5 | 5 | 10 (5 × 2 times) | 5 | 5 | — | — |
| Luminance (Supposing that uncoated state is 100) | 104.2 | 102.1 | 99.2 | 84.7 | 68.4 | 58.3 | 105.0 | 105.6 | 100.0 | 104.2 | 102.1 | 100.0 | 103.0 |
| Peak wavelength (nm) | 540 | 540 | 540 | 539 | 538 | 538 | 540 | 540 | 540 | 540 | 540 | 540 | 540 |
| Peak intensity (Supposing that uncoated state is 1) | 1.05 | 1.02 | 0.99 | 0.85 | 0.68 | 0.58 | 1.06 | 1.06 | 0.99 | 1.04 | 1.01 | 1.00 | 1.04 |
| Sample Absorbing rate (%) | 83.87 | 81.43 | 78.74 | 70.90 | 59.20 | 52.80 | 83.23 | 82.28 | 80.02 | 81.91 | 79.89 | 80.78 | 83.66 |
| Inner quantum efficiency (%) | 78.09 | 79.13 | 81.80 | 77.39 | 75.29 | 72.12 | 79.38 | 80.72 | 78.12 | 79.48 | 80.06 | 80.09 | 80.57 |
| Outer quantum efficiency (%) | 65.49 | 64.43 | 64.42 | 54.88 | 44.57 | 38.08 | 66.07 | 66.42 | 62.51 | 65.11 | 63.95 | 64.70 | 67.41 |

<Light Emission Characteristics Evaluation>

By using an FP6500 (made by JASCO Corporation), light emission characteristics of the uncoated phosphors and coated phosphors obtained in examples 1 to 11 and comparative example 1 and comparative example 2 were evaluated. The results of the light emission characteristics are shown in Table 1. As the light emission characteristics, luminance, peak wavelength, peak intensity, sample absorbing rate, inner quantum efficiency and outer quantum efficiency were evaluated. The peak intensity represents the peak intensity of each of the coated phosphors supposing that the peak intensity of the uncoated phosphor (comparative example 1) is 1. The sample absorbing rate corresponds to a ratio of incident light corresponding to a reduction from a sample of excited light. Moreover, the inner quantum efficiency corresponds to a value obtained by dividing the number of photons of the excited light absorbed in the sample by the number of photons of the phosphor emitted from the sample. The outer quantum efficiency corresponds to a value ((sample absorbing rate)×(inner quantum efficiency)) obtained by multiplying the sample absorbing rate by the inner quantum efficiency.

With respect to the light emitting characteristics, it was found that coated phosphors obtained in example 2, example 3 and example 11 had the same characteristics as those of uncoated phosphor (comparative example 1).

Moreover, it was found that with respect to the light emitting characteristics, coated phosphors obtained in example 1, example 7, example 8 and example 10 had better characteristics than those of the uncoated phosphor (comparative example 1). It is considered that this is because light is more easily made incident from the outside to the inside of the coated phosphor and is also more easily released from the inside of the coated phosphor toward the outside thereof by the lens effect of a silicon dioxide film.

Furthermore, it was found that with respect to the light emitting characteristics, coated phosphor obtained in example 9, that is, the coated phosphor obtained by carrying out two times (with a total of 10 parts by mass) of the coating processes by using 5 parts by mass of zinc oxide relative to 100 parts by mass of sulfate phosphor, had the same or better characteristics than those of the coated phosphor (example 3) obtained by carrying out one time of the coating process by using zinc oxide of 10 parts by mass.

On the other hand, it was found that the coated phosphors obtained in examples 4 to 6 having 20 parts by mass or more of the compounding amount of zinc oxide were lowered in the light emitting characteristics in comparison with those of the uncoated phosphor (comparative example 1).

<High-Temperature, High-Humidity Environment Test>

In high-temperature, high-humidity environment change tests, evaluation samples obtained in examples 1 to 9, comparative example 1 and comparative example 2 were subjected to high-temperature, high-humidity tests of 60° C., 90% RH so that changes were confirmed from the initial light emitting intensity or the like to 500 hours after the completion of the tests. For the light emitting intensity measurements, the FP6500 (made by JASCO Corporation) was used. Table 2 and FIG. 9 show the results of the high-temperature, high-humidity environment change tests.

TABLE 2

| Sample | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|
| Light emitting intensity maintaining rate 0 hour later (%) | 100 | 100 | 100 | 100 | 100 | 100 | 100 | 100 | 100 | 100 | 100 |
| Light emitting intensity maintaining rate 200 hour later (%) | 102 | 101 | 102 | 102 | 97 | 98 | 102 | 102 | 102 | 91 | 99 |
| Light emitting intensity maintaining rate 300 hour later (%) | 101 | 102 | 102 | 101 | 94 | 93 | 101 | 101 | 102 | 82 | 99 |
| Light emitting intensity maintaining rate 500 hour later (%) | 106 | 100 | 100 | 102 | 96 | 93 | 102 | 103 | 103 | 50 | 96 |

It was found that in the uncoated phosphor (comparative example 1), the light emitting intensity is lowered to half after 500 hours of the high-temperature, high-humidity tests of 60° C., 90% RH. On the other hand, it was found that in the coated phosphor (comparative example 2) coated with a silicon dioxide film, virtually 100% of the light emitting intensity can be maintained.

It was found that in the coated phosphors (example 1 to example 9) coated with the silicon dioxide film containing zinc oxide powder, virtually 100% of the light emitting intensity maintaining rates can be maintained and that some of them have better light emitting intensity maintaining rates than those of the coated phosphor obtained in comparative example 2. Based upon these results, it was found that zinc oxide causes no adverse effects to the silicon oxide film with respect to the light emitting intensity maintaining rate under high-temperature, high-humidity environments.

<Silver Piece Corrosion Test>

Silver piece tests were carried out so as to obtain an index for hydrogen sulfide gas emission. A silver piece having a diameter of 15 mm and a thickness of 2 mm (silver bullion (purity: 99.95% or more) specified by JIS H 2141 "silver bullion") was polished by a metal polishing agent (PiKAL: made by Nihon Maryo Kogyo Co., Ltd.) and subjected to an ultrasonic-wave washing process in acetone. As shown in FIG. 10, a silver piece 30 after the ultrasonic-wave washing process was pasted onto the rear surface 32A of the lid 32 of a tightly closed bottle 31 (100 ml weighing bottle made of glass) with a double-sided tape. Water was put in a glass cell 33 and this was put into the tightly-closed bottle 31 so as to maintain a humidity of 100% RH. Moreover, on the bottom surface of the inside of the tightly-closed bottle 31, each of the coated phosphors (uncoated phosphors) 34 obtained in examples 1 to 11 and comparative example 1 and comparative example 2 was placed. The lid 32 of the tightly-closed bottle 31 was closed, and sealed with a parafilm and a polyimide tape, and loaded into an oven and kept at 85° C. for 6 hours.

With respect to the evaluation of the silver piece, the reflectance was measured at wavelengths of 380 to 780 nm by using the FP6500, and measured values were averaged so that the average reflectance was evaluated. Table 3 shows the results of the average reflectance.

Each of the coated phosphors obtained in examples 1 to 11, which was coated with a silicon dioxide film containing zinc dioxide, had an average reflectance of about two times or more higher than that of the uncoated phosphor obtained in comparative example 1; therefore, the corrosion was found to be further suppressed. It is considered that this effect is obtained because sulfur-based gases released from the sulfide phosphor by hydrolysis of the sulfide phosphor in the coated phosphor are adsorbed by the zinc oxide powder, it may be possible to suppress the release of the sulfur-based gases.

With respect to the results of the average reflectance, the coated phosphor obtained in example 7 had virtually the same results as those of the coated phosphor obtained in comparative example 2; however, with respect to outside appearance evaluation by visual observation, it had better results than those of the coated phosphor obtained in comparative example 2.

It was found that in the case of the coated phosphor obtained in example 8 in which zinc oxide having a small particle diameter (0.02 to 0.03 μm) was used, virtually the same average reflectance as those of the coated phosphors obtained in examples 1 to 6 in which zinc oxide having a particle diameter of 0.1 to 0.2 μm was obtained.

It was found that in the case of the coated phosphor (example 9) in which coating processes of two times were carried out by using zinc oxide of 5 parts by mass relative to 100 parts by mass of sulfide phosphor, with respect to light emitting characteristics, the average reflectance was improved in comparison with a coated phosphor (example 3) in which a coating process of one time was carried out by using zinc oxide of 10 parts by mass.

It was found that among the coated phosphors obtained in example 2, example 10 and example 11 in which the same amount of zinc oxide powder (5 parts by mass relative to 100 parts by mass of sulfide phosphor) was used, when the average reflectances of the coated phosphor obtained in example 2 and the coated phosphor obtained in example 10 were compared with each other, the same reflectance was obtained. Moreover, it was found that when the average reflectances of the coated phosphor obtained in example 2 and the coated phosphor obtained in example 11 were compared with each other, the coated phosphor of example

TABLE 3

| Sample | Example 1 | Example 2 | Example 3 | Example 4 | Example 5 | Example 6 | Example 7 | Example 8 | Example 9 | Example 10 | Example 11 | Comparative Example 1 | Comparative Example 2 |
|---|---|---|---|---|---|---|---|---|---|---|---|---|---|
| Average reflectance (%) (Supposing that reflectance of silver piece is 100) | 48.75 | 61.25 | 60.75 | 78.00 | 67.75 | 71.88 | 31.88 | 52.25 | 67.50 | 61.25 | 67.25 | 26.00 | 31.13 |

In the case when the application of the uncoated phosphor obtained in comparative example 1 was compared with the application of the coated phosphor obtained in comparative example 2, because the sulfide phosphor was coated with a silicon dioxide film in the case of the application of the coated phosphor obtained in comparative example 2, the corrosion of silver was found to be slightly alleviated.

11 had better results. Based upon these results, it was found that among the coated phosphors obtained in example 2, example 10 and example 11, the coated phosphor obtained in example 11 had the highest average reflectance and was capable of suppressing corrosion most effectively. It is considered that this effect is obtained because in the coated phosphor, the sulfide phosphor is coated with two layers or more of the silicon dioxide films, with the zinc oxide powder serving as the metal oxide powder being contained in the silicon dioxide film on the outermost surface side.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

REFERENCE SIGNS LIST

1 . . . coated phosphor,
2 . . . sulfide phosphor,
3 . . . metal oxide powder,
4 . . . silicon dioxide film,
10 . . . white light source,
11 . . . element substrate,
12 . . . pad portion,
13 . . . blue light emitting element,
14 . . . electrode,
15 . . . electrode,
16 . . . lead wire,
17 . . . lead wire,
18 . . . resin layer,
19 . . . opening portion,
20 . . . reflection film,
21 . . . kneaded matter,
22 . . . illumination device,
23 . . . illumination substrate,
24 . . . illumination device,
25 . . . light emitting structure,
26 . . . substrate,
27 . . . diffusion plate,
28 . . . phosphor sheet,
29 . . . optical film,
30 . . . silver piece,
31 . . . tightly closed bottle,
32 . . . lid,
33 . . . glass cell,
34 . . . coated phosphor

The invention claimed is:

1. A coated phosphor, comprising:
a sulfide phosphor coated with silicon dioxide film,
wherein the silicon dioxide film comprises a zinc oxide powder having a particle diameter of 0.2 μm or less, and
wherein the silicon dioxide has a thickness between 50 to 150 nm.

2. The coated phosphor according to claim 1, wherein the metal oxide powder is such that less than 20 parts by mass of the zinc oxide powder relative to 100 parts by mass of the sulfide phosphor is blended therein.

3. The coated phosphor according to claim 2, wherein the sulfide phosphor is coated with at least two layers of the silicon dioxide film, at least one of the at least two layers having the metal oxide powder contained therein.

4. The coated phosphor according to claim 3, wherein the metal oxide powder is contained in silicon dioxide film on an outermost surface side.

5. The coated phosphor according to claim 1, wherein the sulfide phosphor is $SrGa_2S_4$:Eu.

6. A method for producing a coated phosphor, the method comprising:
mixing a sulfide phosphor, an alkoxysilane, a zinc oxide powder having a particle diameter of 0.2 μm or less, and a catalyst in a solvent such that the sulfide phosphor is coated with a silicon dioxide film,
wherein the silicon dioxide film comprises the zinc oxide powder, and
wherein the zinc oxide powder is composed of the alkoxysilane.

7. A white light source comprising:
a blue light emitting element formed on an element substrate; and
a kneaded matter disposed on the blue light emitting element and formed by kneading, in a transparent resin, a red phosphor and either a green phosphor or a yellow phosphor,
wherein a sulfide phosphor is coated with the green phosphor and a silicon dioxide film with a zinc oxide powder having a particle diameter of 0.2 μm or less comprised therein, and
wherein the silicon dioxide has a thickness between 50 to 150 nm.

8. An illumination device comprising:
a light-emitting structure comprising a transparent resin having a blue light emitting element therein;
a substrate on which the light-emitting structure is arranged; and
a phosphor sheet comprising a powder-state phosphor to obtain white light from blue light emitted from the blue light emitting element, the phosphor sheet disposed apart from the substrate,
wherein the powder-state phosphor is formed by coating a sulfide phosphor with a silicon dioxide film comprising a zinc oxide powder having a particle diameter of 0.2 μm or less, and
wherein the silicon dioxide has a thickness between 50 to 150 nm.

9. The coated phosphor according to claim 2, wherein the sulfide phosphor is $SrGa_2S_4$:Eu.

10. The coated phosphor according to claim 3, wherein the sulfide phosphor is $SrGa_2S_4$:Eu.

11. The coated phosphor according to claim 4, wherein the sulfide phosphor is $SrGa_2S_4$:Eu.

* * * * *